United States Patent
Shapiro et al.

(10) Patent No.: US 6,728,276 B2
(45) Date of Patent: Apr. 27, 2004

(54) SYSTEM FOR CONTROLLING BIAS CURRENT IN LASER DIODES WITH IMPROVED SWITCHING RATES

(75) Inventors: Philip D. Shapiro, Palo Alto, CA (US); Daniel K. Case, Gilroy, CA (US); The' Linh Nguyen, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/285,203

(22) Filed: Oct. 30, 2002

(65) Prior Publication Data
US 2004/0047376 A1 Mar. 11, 2004

Related U.S. Application Data (63) Continuation of application No. 10/188,575, filed on Jul. 2, 2002, now abandoned.
(60) Provisional application No. 60/408,587, filed on Sep. 5, 2002.

(51) Int. Cl.$^7$ .................................................. H01S 3/00
(52) U.S. Cl. .................................. 372/38.02; 372/38.03
(58) Field of Search .............................. 372/38; 359/152

(56) References Cited

U.S. PATENT DOCUMENTS 5,726,965 A * 3/1998 Hajjar et al. .............. 369/53.33
6,345,062 B1 * 2/2002 Taguchi et al. .......... 372/38.01

* cited by examiner

*Primary Examiner*—Paul Ip
*Assistant Examiner*—Hung Vy
(74) *Attorney, Agent, or Firm*—Workman Nydegger (57) ABSTRACT

The present invention relates generally to laser diodes, and particularly to an operational amplifier able to switch laser diodes on and off quickly without adversely affecting data transmission by the laser diodes. A differential amplifier included in an operational amplifier has a high transconductance when a laser diode is first turned on and a low, near constant transconductance when the laser diode is transmitting data. The operational amplifier is preferably incorporated in optoelectronic transceivers used in passive optical networks. Switching laser diodes on and off quickly enables more efficient use of network bandwidth in such passive optical networks.

14 Claims, 9 Drawing Sheets

SYSTEM FOR CONTROLLING BIAS CURRENT IN LASER DIODES WITH IMPROVED SWITCHING RATES

The present application claims priority, under 35 U.S.C. 120, to a United States Non-Provisional Patent Application, which is incorporated herein by reference, entitled "SYSTEM FOR CONTROLLING BIAS CURRENT IN LASER DIODES WITH IMPROVED SWITCHING RATES," filed on Jul. 2, 2002, and identified by application Ser. No. 10/188,575, now abandoned.

The present application also claims priority, under 35 U.S.C. 119(e), to a United States Provisional Patent Application, which is incorporated herein by reference, entitled "SYSTEM FOR CONTROLLING BIAS CURRENT IN LASER DIODES WITH IMPROVED SWITCHING RATES," filed on Sep. 5, 2002, and identified by Ser. No. 60/408,587.

BRIEF DESCRIPTION OF THE INVENTION

The present invention relates generally to semiconductor lasers, and particularly to operational amplifiers configured to switch semiconductor lasers on and off.

BACKGROUND OF THE INVENTION

Passive optical networks enable a plurality of optoelectronic transceivers to share one or more optical fibers while transmitting and receiving data in an optical form. Typically, passive optical networks employ a time division multiplexing access (TDMA) scheme to make this possible. In such schemes, the data transmission capabilities of the plurality of optoelectronic transceivers are operational only during separate, non-overlapping periods of time.

When the turn-on and turn-off times of the optoelectronic transceivers decrease, the amount of time available to each optoelectronic transceiver in a passive optical network to transmit optical data increases. Prior art optoelectronic transceivers are able to turn a laser diode on and off within 100 microseconds to 1 millisecond.

Persons skilled in the art, moreover, recognize that turning a laser diode on and off is a time consuming aspect of turning an optoelectronic transceiver on and off. Passive optical networks, therefore, require laser diodes to be turned on and off quickly to make efficient use of network bandwidth.

A laser diode is typically embedded in a feedback loop of an optoelectronic transceiver. This feedback loop turns the laser diode on, and then maintains the laser diode in a linear operating range so that it is able to transmit data efficiently. Maintaining the operational efficiency of the laser diode includes adjustments to the output of an operational amplifier, which is a portion of the feedback loop. Persons skilled in the art recognize that the optical output power of a given laser diode may fluctuate in ways that are inconsistent with electrical input that is intended to modulate the optical output of the laser diode. The purpose of the feedback loop is to counteract these unwanted fluctuations.

In particular, the operational amplifier produces a bias current to maintain the operational efficiency of the laser diode. However, feedback loops (e.g., operational amplifiers) with a large bandwidth tend to null out the electrical input that is intended to modulate the optical output of a corresponding laser diode. This is so because the bandwidth of a feedback loop may overlap some or all of the bandwidth of the electrical input. This is problematic in the context of passive optical networks because feedback loops with a large bandwidth are ideal for turning a laser diode on and off quickly (and thus enable optoelectronic transceivers in a passive optical network to transmit more optical data or the inclusion of additional optoelectronic transceivers in the passive optical network). More specifically, feedback loops with a large bandwidth are able to modulate the optical output strength of a given laser diode at a relatively high frequency.

What is needed in the art, therefore, is an optoelectronic transceiver capable of turning a laser diode on and off within 0.1 to 1.0 microseconds that does not adversely affect electrical input.

SUMMARY OF THE INVENTION

An embodiment of the present invention is directed to a three stage operational amplifier for controlling bias current in a laser diode. The first stage includes a differential amplifier configured to receive as input a reference voltage and a laser diode voltage. The laser diode voltage represents an optical output strength of a laser diode and the reference voltage corresponds to a desired magnitude of the laser diode voltage. A second stage includes a capacitor and is configured to integrate an output current produced by the first stage to generate a first output voltage. A third stage includes an output buffer configured to receive as input the first output voltage to generate a second output voltage that is approximately equal to the first output voltage. The second output voltage is applied to a voltage controlled current source to control the magnitude of a bias current for the laser diode. The differential amplifier of the first stage if formed from a symmetrical assembly of transistors such that a transconductance of the differential amplifier approaches a constant when a difference between the desired magnitude of the laser diode voltage and the actual laser diode voltage is substantially zero volts and increases exponentially as this difference increases.

Another embodiment of the present invention is directed to a three stage operational amplifier for controlling bias current in a laser diode. The first stage includes a differential amplifier configured to receive as input a reference voltage and a laser diode voltage. The laser diode voltage represents an optical output strength of a laser diode and the reference voltage corresponds to a desired magnitude of the laser diode voltage. The second stage includes a capacitor configured to integrate an output current produced by the first stage to produce a first output voltage. The third stage includes an output buffer configured to receive as input the first output voltage to produce a second output voltage that is approximately equal to the first output voltage. The second output voltage is applied to a voltage controlled current source to control the magnitude of a bias current for the laser diode. The operational amplifier also includes a voltage comparator to compare the laser diode voltage to the reference voltage. The voltage comparator directs a boosting current from a current source to the second stage when a difference between the laser diode voltage and the reference voltage is greater than or equal to a predefined amount.

Yet another embodiment of the present invention is directed to a three stage operational amplifier. The first stage includes a differential amplifier configured to receive as input a reference voltage and a laser diode voltage. The laser diode voltage represents an optical output strength of a laser diode and the reference voltage corresponds to a desired magnitude of the laser diode voltage. The second stage has a plurality of stages. Each of the stages includes at least a capacitor for integrating an output current produced by the first stage to produce a first output voltage. The third stage includes an output buffer configured to receive as input the first output voltage to produce a second output voltage that is approximately equal to the first output voltage. The second output voltage is applied to a voltage controlled current source to control the magnitude of a bias current for the laser diode. The operational amplifier also includes a voltage comparator to compare the laser diode voltage to the reference voltage. The voltage comparator selects one of the stages from the second stage by reference to a relationship between the laser diode voltage and the reference voltage.

In still other embodiments, the present invention includes a plurality of optoelectronic transceivers, a coordinator, a controller, an optical combiner, and a shared communication line in a passive optical network. The coordinator is configured to assign each of the plurality of optoelectronic transceivers to a separate portion of a cyclical time period. The controller is configured to turn optical data transmit capabilities of the plurality of optoelectronic transceivers on and off during their respective separate portions of the cyclical time period. The optical combiner is configured to relay optical data received from the plurality of optoelectronic transceivers to the shared communication line. And each of the plurality of optoelectronic transceivers includes an operational amplifier consistent with one of the embodiments described in the preceding paragraphs.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 1:
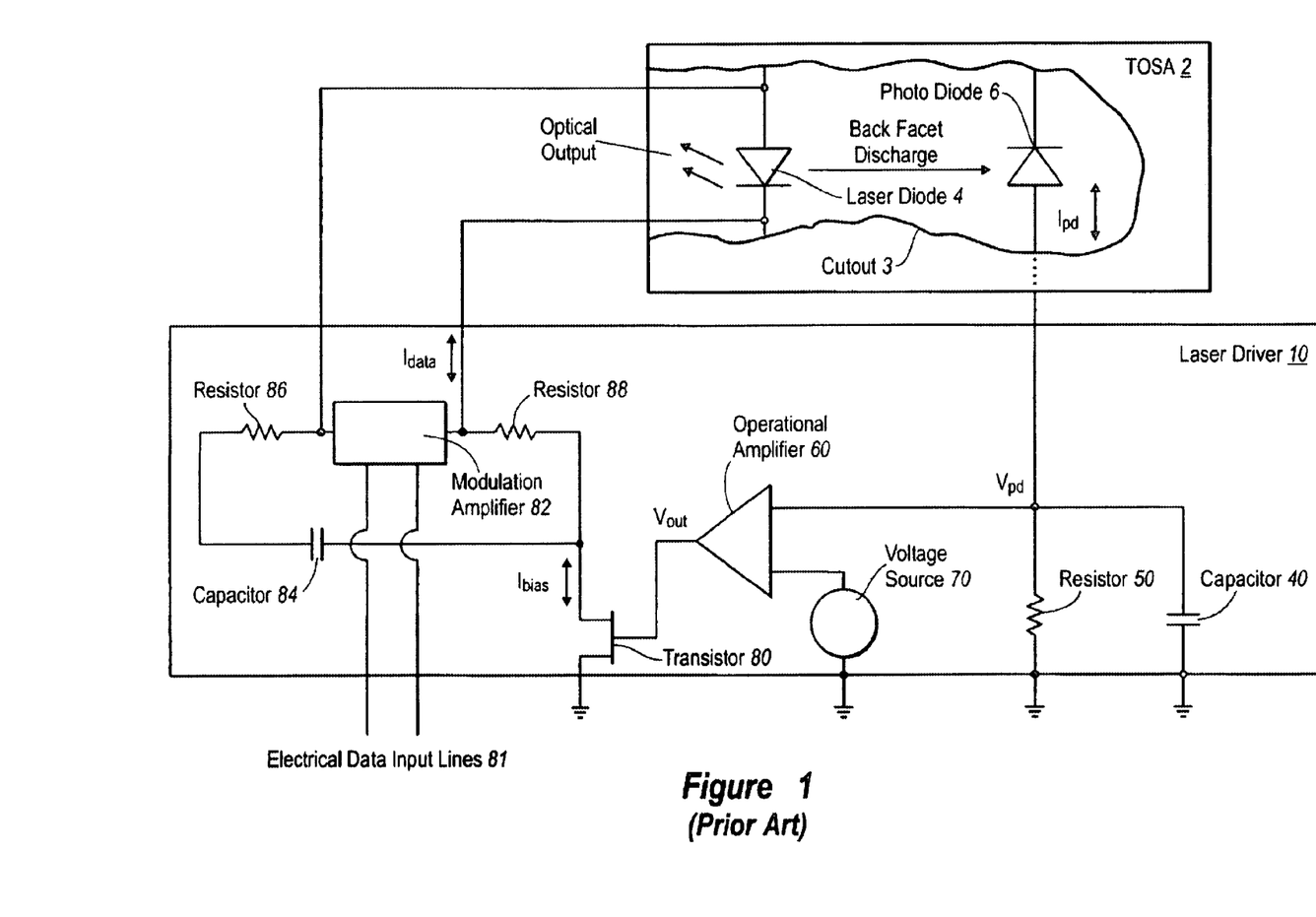
FIG. 1 is an illustration of an exemplary feedback loop for a laser diode.

Referring to FIG. 1, there is shown an exemplary feedback loop, including a laser driver 10 and a transmitter optical subassembly ("TOSA") 2, for controlling a bias current in a laser diode 4 embedded in the TOSA 2. Persons skilled in the art recognize that a bias current pushes the laser diode 4 beyond its threshold value into a linear operating range. Once in a linear operating range, the optical output strength of the laser diode 4 is modulated by electrical input.

As shown in the cutout 3, the TOSA 2 includes the laser diode 4 and a photodiode 6. The TOSA 2 also includes other components that are not illustrated. The laser driver 10 includes a first capacitor 40, a first resistor 50, an operational amplifier 60, a voltage source 70, a transistor 80, electrical input lines 81, a modulation amplifier 82, a second capacitor 84, a second resistor 86, a third resistor 88, and other components not illustrated.

The photodiode 6 detects light emitted from the back facet of the laser diode 4, which is proportional to the optical output strength of the laser diode 4. The photodiode 6 converts the detected light into the current $I_{pd}$. The current $I_{pd}$ passes from the TOSA 2 to the laser driver 10 and across the first resistor 50 and the first capacitor 40 to produce the voltage $V_{pd}$. Voltage $V_{pd}$ is an input to the operational amplifier 60.

The operational amplifier 60 produces an output that is a function of two inputs. The first input to the operational amplifier 60 is the voltage $V_{pd}$ as noted above; the second input to the operational amplifier 60 is a reference voltage $V_{ref}$. $V_{ref}$ is produced by the voltage source 70. The output voltage $V_{out}$ of the operational amplifier 60 is connected to the gate of a transistor 80 (a.k.a., a voltage controlled current source). The output voltage $V_{out}$ thus controls the current $I_{bias}$ that flows through the transistor 80 and thus through the laser diode 4 to bias the laser diode 4. The current $I_{bias}$, therefore, affects the optical output strength of the laser diode 4.

Also affecting the optical output strength of the laser diode 4 is the modulation amplifier 82. The modulation amplifier 82 amplifies the electrical input received over the electrical input lines 81 to produce an electrical signal in the form of the current $I_{data}$, which mixes with the current $I_{bias}$ to control the optical output of the laser diode 4. As illustrated in FIG. 1, the output of the laser driver 10 passes from the laser driver 10 to the TOSA 2 generally and to the laser diode 4 therein specifically.

The second capacitor 84 and the second and third resistors 86, 88 are exemplary components included the laser driver 10, and which form part of the laser diode feedback loop. Other circuit configurations are possible and within the scope of the present invention.

Ideally, the optical output strength of the laser diode 4, which as described above is controlled by $I_{data}$ and $I_{bias}$, results in a voltage $V_{pd}$ that matches the voltage $V_{ref}$. When this occurs, the laser diode 4 is in a linear operating range, and operating efficiently. The operational amplifier 60, in preferred embodiments of the present invention, is configured, therefore, to adjust $V_{out}$ so that $V_{pd}$ matches the voltage $V_{ref}$. In other embodiments of the invention, the operational amplifier 60 is configured to, for example, adjust $V_{out}$ so that $V_{pd}$ have a predefined relationship to each other, such as a predefined ratio or offset with respect to each other.

Figure 2:
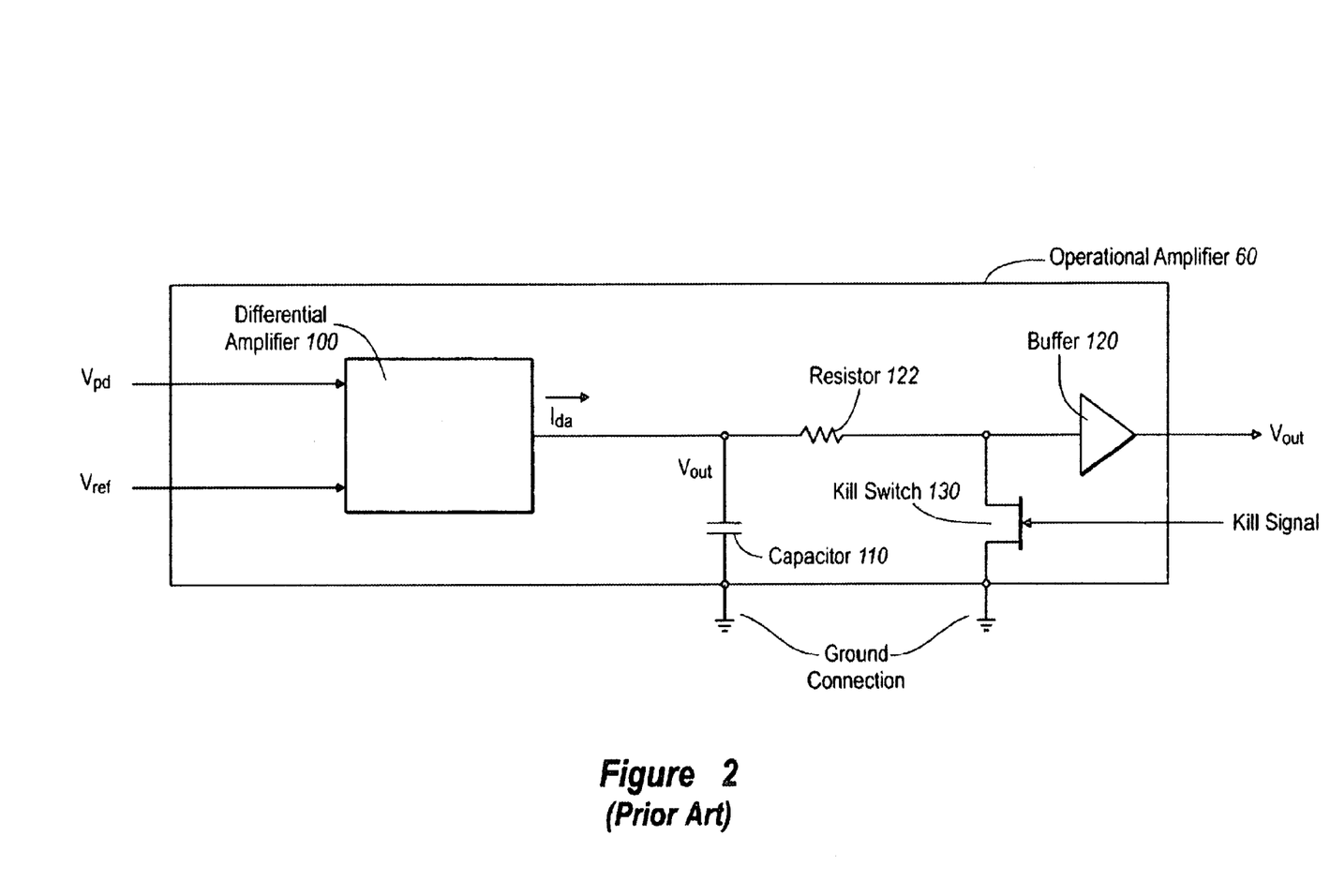
FIG. 2 is an illustration of a prior art operational amplifier used in feedback loops for laser diodes.

FIG. 2 shows internal components of a three stage, prior art operational amplifier 60. Included in the operational amplifier 60 is a differential amplifier 100, a capacitor 110, a buffer 120, and a kill switch 130. The first stage of the operational amplifier 60 is the differential amplifier 100, which may amplify and convert a difference between the voltages $V_{pd}$ and $V_{ref}$ to produce the current $I_{da}$.

The second stage of the operational amplifier 60 includes the capacitor 110. The current $I_{da}$ flows through the capacitor 110 to ground (also called circuit ground). While this occurs, the capacitor 110 integrates the current $I_{da}$ to produce the voltage $V_{out}$. The voltage $V_{out}$ across the capacitor 110 is given by the following equation:

$$\frac{1}{C}\int I_{da} dt,$$

where C is the capacitance value of the capacitor 110 and t is time.

The third stage of the operational amplifier 60 includes the buffer 120. The input to the buffer 120 is the voltage $V_{out}$, and the output of the buffer 120 is $V_{out}$ as well. The purpose of the buffer 120 is to electrically isolate the capacitor 110 from loads placed on the output of the operational amplifier 60. In this way, a load (e.g., the transistor 80 in FIG. 1) does not change the characteristics of the operational amplifier 100 by drawing current from capacitor 110.

The kill switch 130 is an exemplary means for disabling and enabling the operational amplifier 60. More specifically, the kill switch 130 typically is a transistor that can short the current $I_{da}$ and drain any charge from the capacitor 110 in response to a kill signal from an external source. When the current $I_{da}$ is shorted and any charge from the capacitor 110 is drained, the voltage $V_{out}$ is pulled to ground. Additionally, a resistor 122 is preferably included between both the capacitor 110 and the differential amplifier 100 and the kill switch 130. This resistor prevents damaging current spikes each time the kill switch 130 is activated to short the current $I_{da}$ and drain any charge from the capacitor 110.

Figures 3A, 3B:
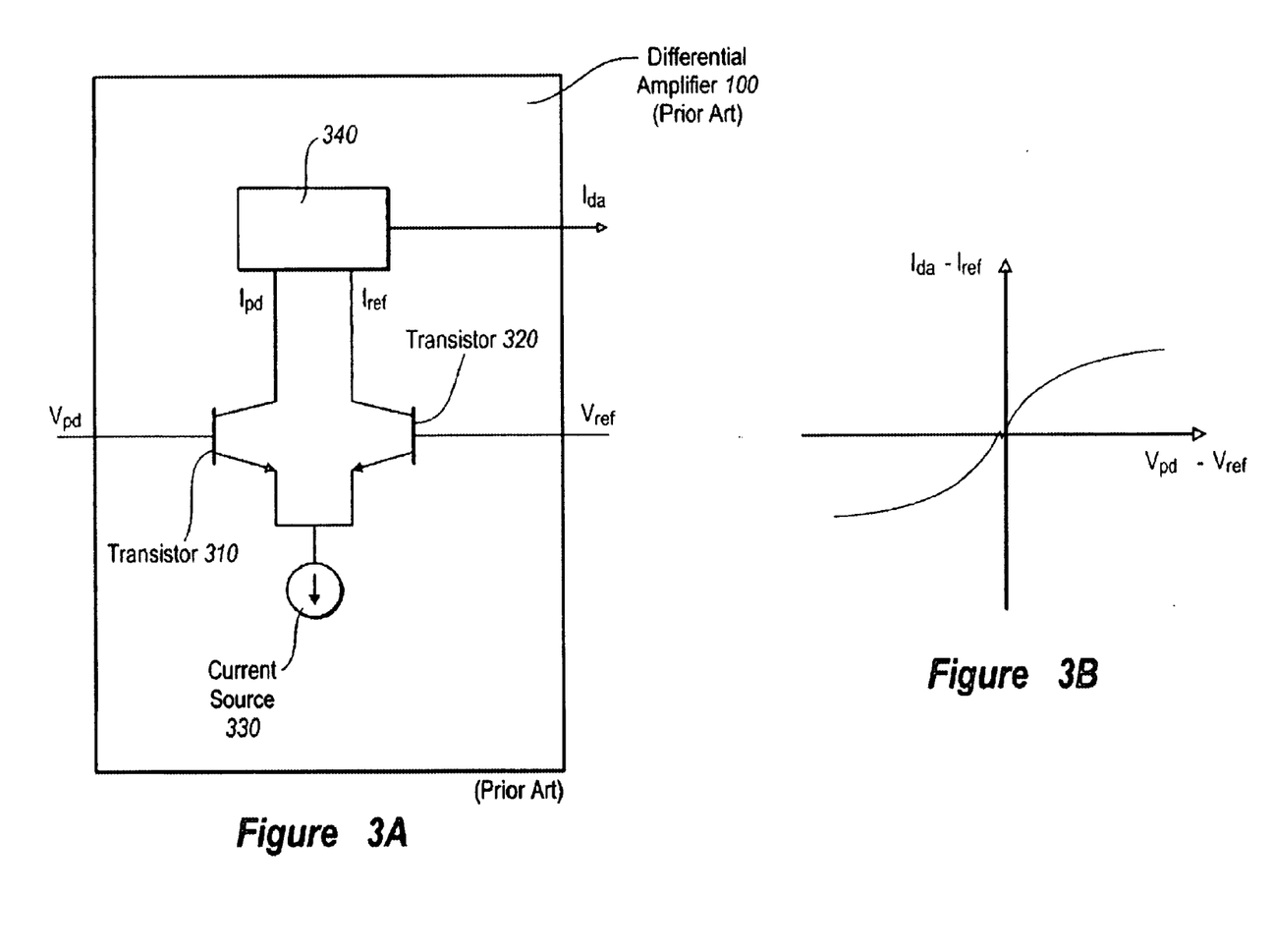
FIG. 3A is an illustration of a prior art differential amplifier found in prior art operational amplifiers.
FIG. 3B is a graph of the transconductance of the differential amplifier illustrated in FIG. 3A.

Referring now to FIG. 3A, there is shown a prior art differential amplifier 100. The differential amplifier 100 includes a first and second transistor 310, 320, a current source 330, and a current mirror 340. The first and second transistors 310, 320 are identical. The base of the first transistor 310 is connected to the voltage $V_{pd}$ and the emitter of the first transistor 310 is tied to the emitter of the second transistor 320 and the current source 330. The collector of the first and second transistors 310, 320 are separately connected to the current mirror 340. And the base of the second transistor is connected to the voltage $V_{ref}$. The two currents $I_{pd}$ and $I_{ref}$ flow through the first and second transistors 310, 320 respectively and into or out of the current mirror 340. The current mirror 340 is an arbitrary circuit that subtracts the current $I_{ref}$ from the current $I_{pd}$ to produce the current $I_{da}$.

Because the emitters of the first and second transistors 310, 320 are tied together, the voltage at both emitters is the same. As persons skilled in the art recognize, current flow through a transistor is controlled in part by the voltage across the base and emitter. And because the voltage at the emitters of the first and second transistors 310, 320 is identical and the current supplied by the current source 330 is shared by the first and second transistors 310, 320, the current that flows through the first and second transistors 310, 320 is controlled by the relative values of the voltages $V_{pd}$ and $V_{ref}$. This may mean, for example, that when $V_{pd}$ and $V_{ref}$ are the same, the currents $I_{pd}$ and $I_{ref}$ are nearly identical (e.g., one half of the value of the current source 330) and cancel each other out (e.g., $I_{da}=I_{pd}-I_{ref}$) Further, if the voltage $V_{pd}$ is, for example, greater than the voltage $V_{ref}$, $I_{pd}$ is greater than $I_{ref}$ and vice versa. And finally, the current flow through one of the transistors equals the value of the current source 330 only when the other transistor turns off entirely. This occurs when the voltage $V_{pd}$ or $V_{ref}$ is not high enough to enable current flow through a respective transistor 310, 320.

The transconductance of the differential amplifier 100 (e.g., $(I_{pd}-I_{ref})/(V_{pd}-V_{ref})$) is illustrated in FIG. 3B. As shown in FIG. 3B, the slope of the transconductance, of the differential amplifier 100 increases (e.g., a difference between $I_{pd}$ and $I_{ref}$ changes at a higher rate) as voltages $V_{pd}$ and $V_{ref}$ converge. Similarly, as a difference between $V_{pd}$ and $V_{ref}$ increases, the slope of the transconductance approaches a constant. Ultimately, the slope of the transconductance is effectively constant when a difference between $I_{pd}$ and $I_{ref}$ is equal to the value of the current source 330. This may mean that beyond a certain threshold, increases in a difference between $V_{pd}$ and $V_{ref}$ have no significant effect on the value of the current $I_{da}$ (e.g., the gain of the operational amplifier 60 approaches zero).

In the context of a laser diode 4 feedback loop, the greatest amount of amplification by this operational amplifier 60 takes place when the laser diode 4 is in a linear operating range.

This is problematic because the differential amplifier 100, and thus the feedback loop as a whole, may null out low frequency signal components (e.g., frequency components below the bandwidth of the feedback loop) from the electrical signal (e.g., the current $I_{data}$) transmitted to the laser diode 4. Additionally, the slope of the transconductance approaches a constant (e.g., the gain of the differential amplifier 100 is relatively low) just as the laser diode 4 is turned on (e.g., when a difference between $V_{pd}$ and $V_{ref}$ is greatest) and the operational amplifier 60 attempts to drive the laser diode 4 into a linear operating range.

Figure 4A:
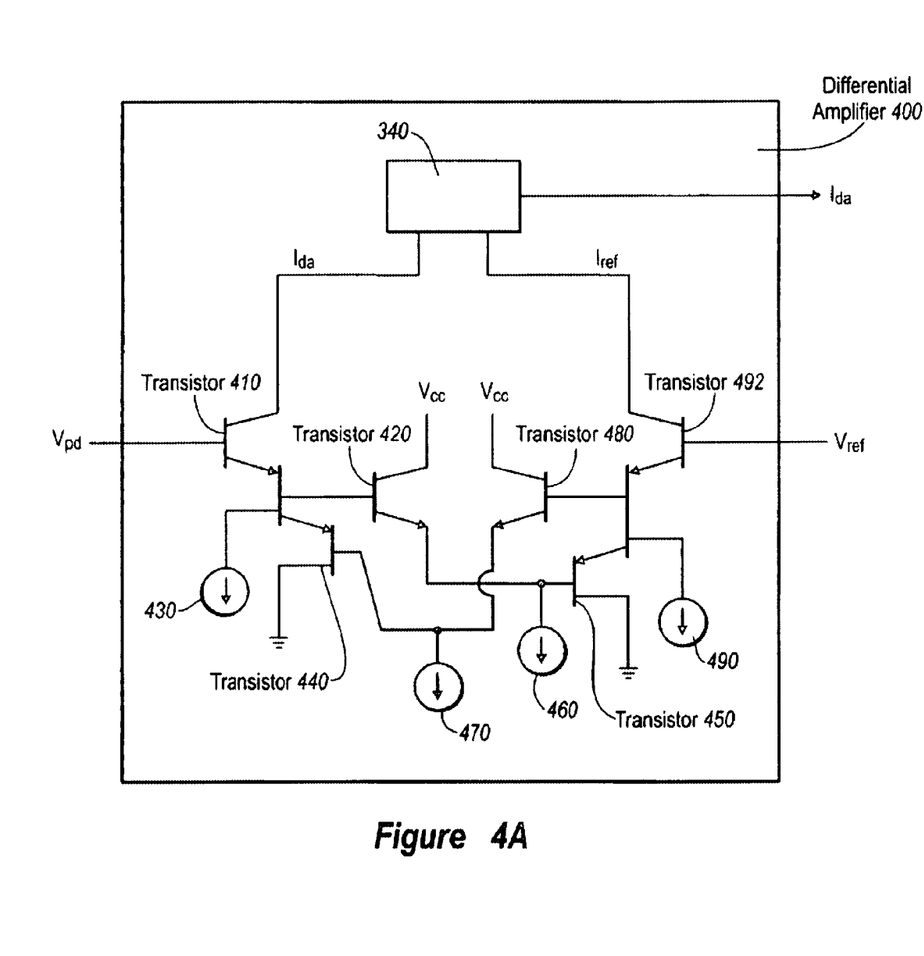
FIG. 4A is an illustration of a differential amplifier consistent with an embodiment of the present invention.

As noted above, operational amplifiers typically consist of three stages. FIG. 4A discloses an embodiment of the present invention in which the first stage of an operational amplifier is adjusted to address the problems with the prior art identified above. More specifically, the differential amplifier 400 illustrated in FIG. 4A is formed from a symmetrical configuration of transistors and current sources. With respect to the first transistor 410, the base is connected to the voltage $V_{pd}$, the collector is connected to a current mirror 340, and the emitter is connected to the base of a second transistor 420, a first current source 430, and the emitter of a third transistor 440. With respect to the second transistor 420, the collector is connected to a voltage $V_{cc}$ and the emitter is connected to the base of a fourth transistor 450 and a second current source 460. With respect to the third transistor 440, the collector is connected to circuit ground and the base is connected to a third current source 470 and the emitter of a fifth transistor 480. With respect to the fourth transistor 450, the collector is connected to circuit ground and the emitter is connected to a fourth current source 490, the base of the fifth transistor 480, and the emitter of a sixth transistor 492. With respect to the fifth transistor 480, the collector is connected to the voltage $V_{cc}$. And with respect to the sixth transistor 492, the base is set to the voltage $V_{ref}$ and the collector is connected to the current mirror 340.

Figure 4B:
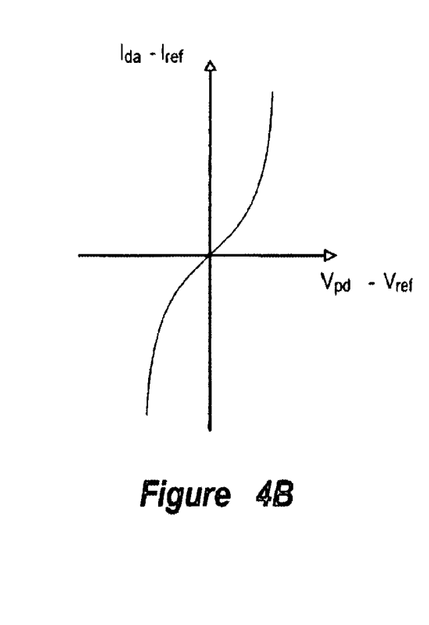
FIG. 4B is a graph of the transconductance of the differential amplifier illustrated in FIG. 4A.

This configuration of transistors results in the transconductance profile illustrated in FIG. 4B. Note that the slope of the transconductance approaches a constant (i.e, the gain of the differential amplifier 400 is reduced) as the voltages $V_{pd}$ and $V_{ref}$ converge. When the laser diode 4 is in or close to a linear operating range, the differential amplifier 400 has relatively little effect on the electrical signal (e.g., the current $I_{data}$) applied to the laser diode 4. Note that in other embodiments of the invention, the transconductance approaches a constant as the voltage $V_{pd}$ approaches a value that is a predefined function (e.g., a multiple or offset) of the voltage $V_{ref}$.

The slope of the transconductance increases exponentially as a difference between $V_{pd}$ and $V_{ref}$ increases. This means that just as the laser diode 4 is turned on (e.g., when a difference between $V_{pd}$ and $V_{ref}$ is greatest), the differential amplifier 400, and thus the feedback loop as a whole, has its greatest effect on the optical output strength of the laser diode 4. Additionally, the current $I_{da}$, the output of the differential amplifier 400, is nearly maximized across a greater range of $V_{pd}$ and $V_{ref}$ differences. Thus, the differential amplifier 400, can continue to have its greatest effect when the laser diode 4 is in or close to a linear operating range.

Of particular importance in the differential amplifier 400 illustrated in FIG. 4A is that the transistor 410 is preferably an npn transistor while the transistor 440 is preferably a pnp transistor. Again, the emitter of the transistor 410 is connected to the emitter of the transistor 440. As a result, the current flowing through the transistor 410 and the transistor 440 are nearly equal in magnitude and direction. In the differential amplifier 100 illustrated in FIG. 3A, the emitters of the two transistors 310, 320 are connected, but both are npn transistors, so the current flowing through each tends to offset and limit the current flowing through the other to the magnitude of the current source 330. This is not the case for the differential amplifier 400 illustrated in FIG. 4A. Instead, a nearly infinite amount of current can flow through the two transistors 410, 440 as $V_{pd}$ increases.

And as noted above, the differential amplifier 400 illustrated in FIG. 4A is symmetrical, so as $V_{pd}$ oscillates around $V_{ref}$, the current flowing through the transistors 492 and 450 is nearly equal in magnitude to the current flowing through the transistors 410 and 440, but flowing in the opposite direction. The current $I_{da}$ produced by the current mirror 340 increases proportionately to changes in the current $I_{pd}$ and the current $I_{ref}$.

Figure 5:
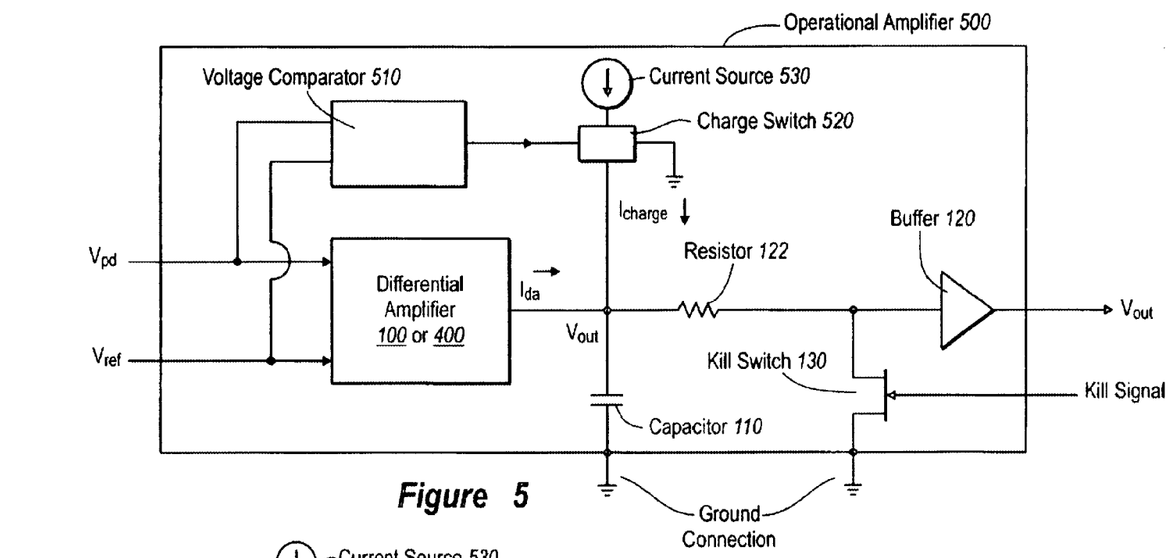
FIG. 5 is an illustration of an operational amplifier consistent with an embodiment of the present invention.

Referring to FIG. 5, there is illustrated another embodiment of the present invention in which the second stage of an operational amplifier is adjusted to address the problems with the prior art identified above. The operational amplifier 500 illustrated in FIG. 5 includes a differential amplifier 100 or 400, a voltage comparator 510, a charge switch 520, a current source 530, a capacitor 110, a kill switch 130, and a buffer 120. The operational amplifier 500 may be used in a laser bias current control system, such as the system shown in FIG. 1, in place of operational amplifier 60 shown in FIG. 1.

The kill switch 130 is an exemplary means for disabling and enabling the operational amplifier 500. More specifically, the kill switch 130 typically is a transistor that can short the current $I_{da}$ and drain any charge from the capacitor 110 in response to a kill signal from an external source. When the current $I_{da}$ is shorted and any charge from the capacitor 110 is drained, the voltage $V_{out}$ is pulled to ground. Additionally, a resistor 122 is preferably included between both the capacitor 110 and the differential amplifier 100 and the kill switch 130. This resistor prevents damaging current spikes each time the kill switch 130 is activated to short the current $I_{da}$ and drain any charge from the capacitor 110.

The first stage of the operational amplifier 500 is the differential amplifier 100 or 400, which as noted above amplifies and converts a difference between the voltages $V_{pd}$ and $V_{ref}$ to produce the current $I_{da}$.

The second stage of the operational amplifier 500 includes the capacitor 110, the voltage comparator 510, the charge switch 520, and the current source 530. Depending on the state of the current switch 520, either the current $I_{da}$, or the current $I_{da}$ and the current $I_{charge}$, flow through the capacitor 110 to circuit ground. While this occurs, the capacitor 110 integrates the current(s) to produce the voltage $V_{out}$.

The third stage of the operational amplifier 500 includes the buffer 120. The voltage $V_{out}$ is the input to the buffer 120. The output of the buffer 120 is also the voltage $V_{out}$. The purpose of the buffer 120 is to electrically isolate the capacitor 110 from loads placed on the output of the operational amplifier 500. In this way, a load (e.g., the transistor 80, FIG. 1) does not change the characteristics of the operational amplifier 500 by drawing current from the capacitor 110.

The voltage comparator 510 is configured to activate the charge switch 520 when, for example, a difference between the voltages $V_{pd}$ and $V_{ref}$ is beyond a defined threshold (e.g., when the laser diode 4 is not in or close to a linear operating range). The charge switch 520, which preferably is formed using two transistors (522, 524, FIG. 5A), either shunts current produced by the current source 530 to circuit ground or allows current produced by the current source 530 to mix with the current $I_{da}$. More specifically, when the charge switch 520 is activated, the current $I_{charge}$ flows through the charge switch 520 and mixes with the current $I_{da}$. When the charge switch 520 is not activated, it shunts the current $I_{charge}$ to ground.

Figure 5A:
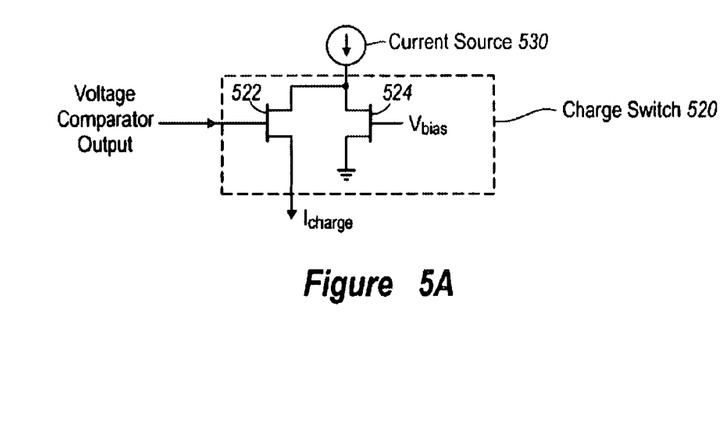
FIG. 5A is an illustration of a charge switch consistent with an embodiment of the present invention.

FIG. 5A shows a preferred embodiment of the charge switch. The gate of the first transistor 422 is connected to the voltage output of the voltage comparator 510, the drain of the first transistor is connected to the second stage, and the source of the first transistor is connected to the current source 530 and to a source of the second transistor. The gate of the second transistor 524 is connected to a bias voltage and the drain of the second transistor 522 is connected to the circuit ground. The bias voltage is preferably set such that when the voltage output of the voltage comparator 510 indicates that a difference between the laser diode voltage and the reference voltage is greater than or equal to a predefined threshold (i.e, a predefined amount), substantially all of the boosting current flows from the current source 530 through the first transistor 522 to the second stage. Further, the bias voltage is set such that when the voltage output of the voltage comparator 510 indicates that a difference between the laser diode voltage and the reference voltage is less than the predefined threshold, substantially all of the boosting current flows from the current source 530 through the second transistor 524 to the circuit ground.

Referring again to FIG. 5, if the kill switch 130 is not activated, the current $I_{charge}$ mixes with the current $I_{da}$ to produce a voltage across the capacitor 110. As a result, the voltage output (e.g., the voltage $V_{out}$) of the second stage of the operational amplifier is boosted by a fixed amount, as determined by the magnitude of the current $I_{charge}$, over a defined range of values for the voltage $V_{pd}$. In other words, the voltage $V_{out}$, which controls the current $I_{bias}$ via a transistor 80 (FIG. 1), is increased when needed most (e.g., when the laser diode 4 is not in or close to a linear operating range).

When, for example, a difference between the voltages $V_{pd}$ and $V_{ref}$ is within the defined threshold, the operational amplifier 500 can behave in much the same way as prior art operational amplifiers 60 depending on the configuration of the differential amplifier utilized (e.g., a prior art differential amplifier 100 or the novel differential amplifier 400 described above).

Because the voltage $V_{out}$ can be adjusted as needed by the use and magnitude of the current $I_{charge}$, the operational amplifier 500 can be configured so that the gain is minimized when the laser diode 4 is in or close to a linear operating range.

Figure 6:
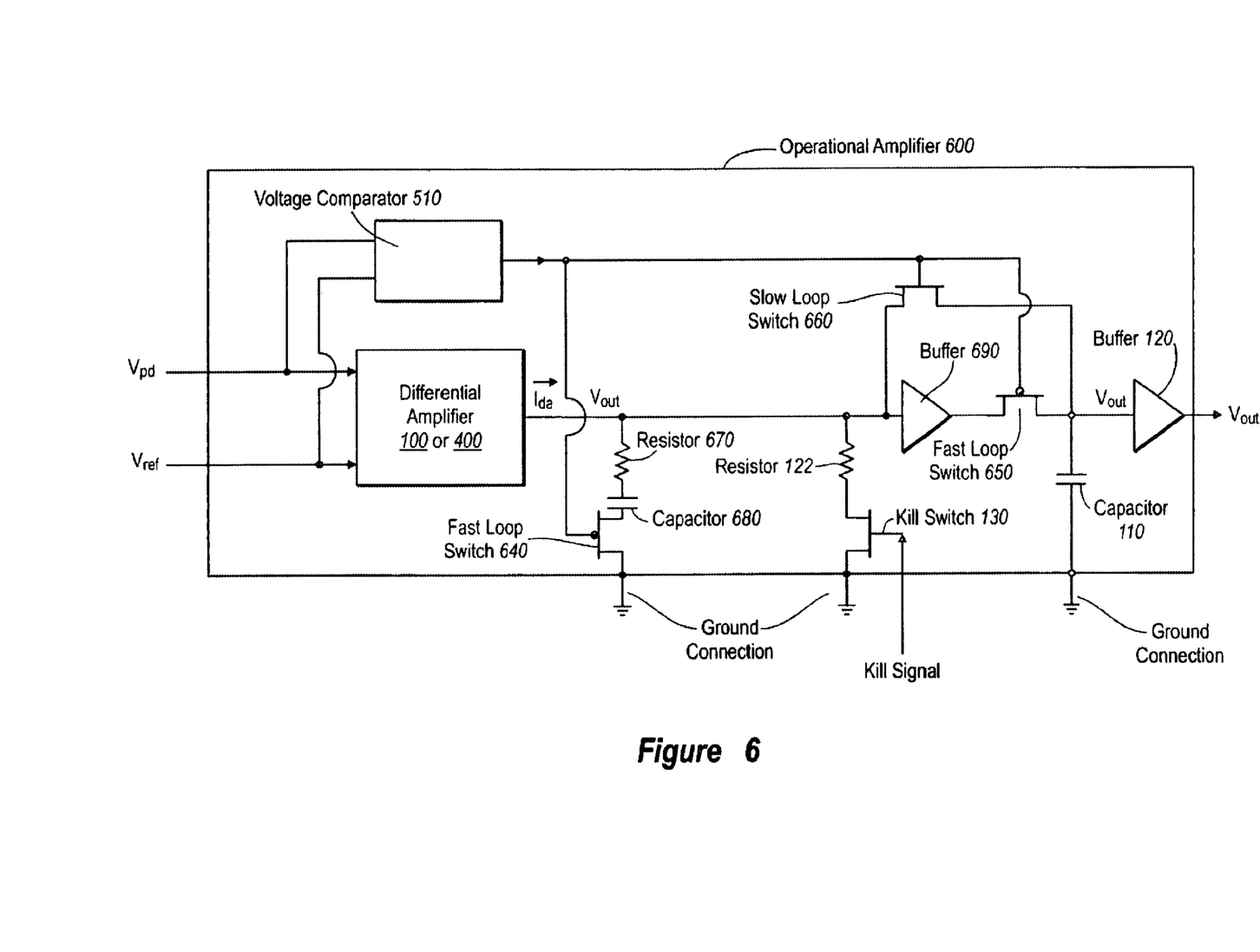
FIG. 6 is an illustration of another operational amplifier consistent with an embodiment of the present invention.

Referring to FIG. 6, there is illustrated another embodiment of the present invention in which the second stage of an operational amplifier is adjusted to address the problems with the prior art identified above. The operational amplifier 600 illustrated in FIG. 6 may be used in place of the operational amplifier 60 included in the feedback loop illustrated in FIG. 1.

The operational amplifier 600 illustrated in FIG. 6 includes a set of switches to control the gain and frequency bandwidth of the operational amplifier 600. In particular, when $V_{pd}$ and $V_{ref}$ are within a defined threshold of each other, the functionality of the second stage of the operational amplifier 600 is controlled primarily by capacitor 110, much like the prior art operational amplifier 60. But when $V_{pd}$ and $V_{ref}$ are not within the defined threshold or ratio of each other, the functionality of the second stage of the operational amplifier 600 is controlled by a capacitor 680 and a resistor 670 in series.

In more detail now, the operational amplifier 600 includes a differential amplifier 100 or 400, a voltage comparator 510, a capacitor 10, a kill switch 130, a buffer 120, a fast loop switch 640, another capacitor 680, a resistor 670, a slow loop switch 660, another fast loop switch 650, and another buffer 690. The first stage of the operational amplifier 600 is the differential amplifier 100 or 400, which as noted above amplifies and converts a difference between the voltages $V_{pd}$ and $V_{ref}$ to produce the current $I_{da}$.

The second stage of the operational amplifier 600 includes the capacitor 110, the voltage comparator 510, the fast loop switch 640, the other capacitor 680, the resistor 670, the slow loop switch 660, and the other fast loop switch 650. The current $I_{da}$ flows through either the resistor 670 and the capacitor 680 or the capacitor 110 depending on the state of the two fast loop switches 640, 650 and the slow loop switch 660.

The third stage of the operational amplifier 600 includes the buffer 120. The voltage $V_{out}$ is the input to the buffer 120. The output of the buffer 120 is also the voltage $V_{out}$. The purpose of the buffer 120 is to electrically isolate the capacitor 110 from loads placed on the output of the operational amplifier 600. In this way, a load (e.g., the transistor 80, FIG. 1) does not change the characteristics of the operational amplifier 600 by drawing current from capacitor 110 and/or capacitor 680.

When a difference or ratio between $V_{pd}$ and $V_{ref}$, as measured by the voltage comparator 510, is greater than a defined predefined threshold, the output of the voltage comparator 510 closes the two fast loop switches 640, 650 and opens the slow loop switch 660 (note the input to the two fast loop switches 640 is preferably inverted so that the single output of the voltage comparator 510 operates on the two fast loop switches 650, 660 and the slow loop switch 660). When the switches are in this state, the operational amplifier 600 is the functional equivalent of the operational amplifier 700 illustrated in FIG. 7.

Figure 7:
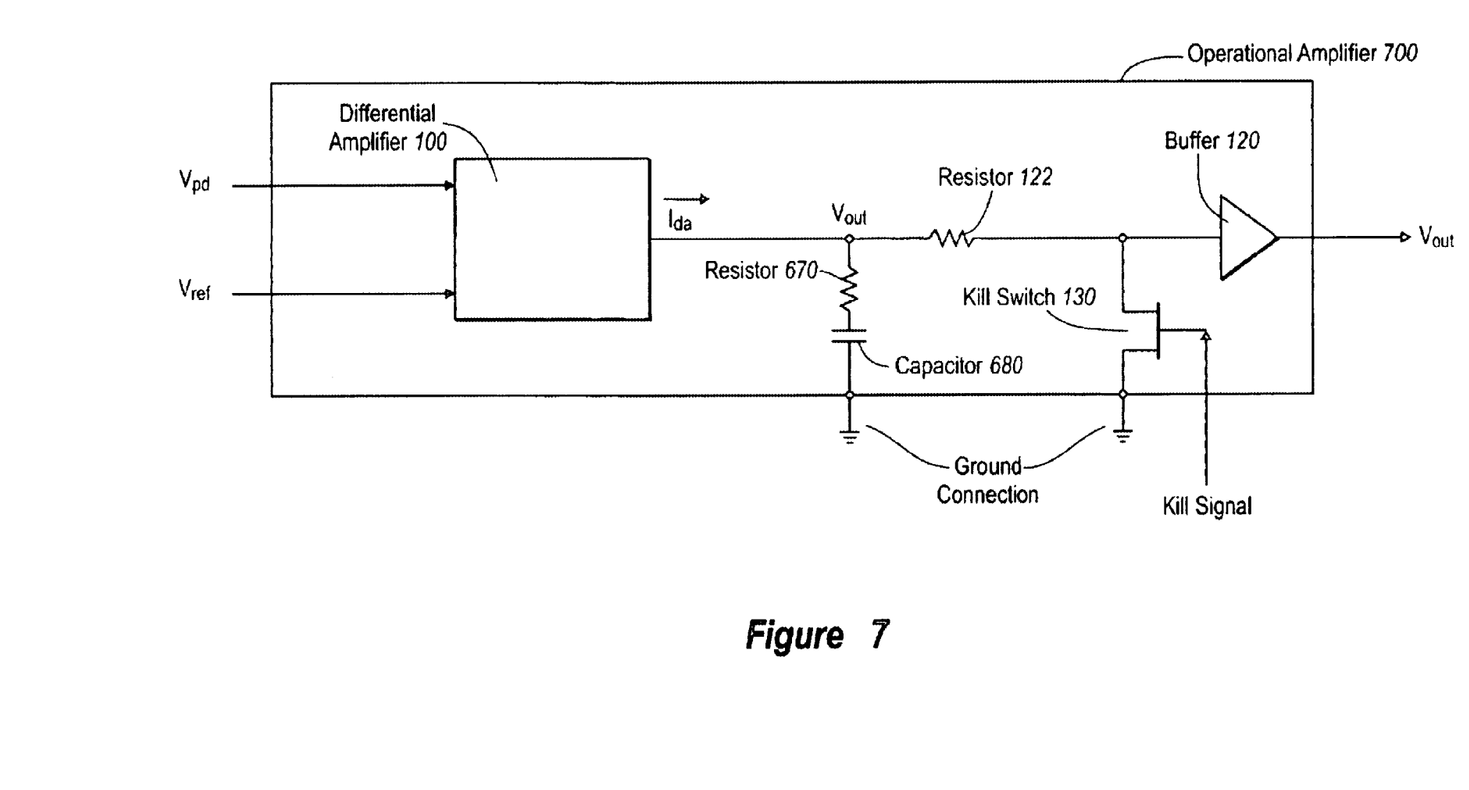
FIG. 7 is an illustration of an operational amplifier that is a functional equivalent of the operational amplifier illustrated in FIG. 6 when in a particular mode of operation.

Note that the buffer 690 and the capacitor 110 are omitted from the operational amplifier 700 even though both are actually active elements of the operational amplifier 700. The voltage output of the buffer 690 is equal to the input voltage despite the presence of the capacitor 110. In other words, the buffer 690 drives the voltage across the capacitor 10 to match the voltage across the resistor 670 and the capacitor 680. The capacitor does not, therefore, significantly affect the gain or frequency bandwidth of the operational amplifier 700 when the switches 640, 650, 660 are in this configuration. The voltage $V_{out}$ of the operational amplifier 700 is, therefore, set by the resistor 670 and the capacitor 680.

Persons skilled in the art recognize that as the frequency of a current increases, the voltage the current produces across a given capacitor 680 decreases. However, the ratio of voltage to current for the resistor 670 is constant even as the frequency of the current increases. As a result, the resistor 670 provides a gain floor for the second stage of the operational amplifier 600 at higher frequencies.

When a difference or ratio between $V_{pd}$ and $V_{ref}$, as measured by the voltage comparator 510, is within the defined threshold, the output of the voltage comparator 510 opens the two fast loop switches 640, 650 and closes the slow loop switch 660. In this state, the operational amplifier 600 is the functional equivalent of the operational amplifier 60 illustrated in FIG. 2.

The kill switch 130 is an exemplary means for disabling the operational amplifier 600 regardless of the switch states. More specifically, the kill switch 130 typically is a transistor that shorts the output $I_{da}$ and drains any charge from the capacitor 680 and/or the capacitor 110 in response to a kill signal from an external source. When the output $I_{da}$ is shorted and the charge from the capacitor 680 and/or the capacitor 10 is drained, the voltage $V_{out}$ is pulled to ground. Additionally, a resistor 122 is preferably included between the capacitor 110, the capacitor 680, and the differential amplifier 100 or 400 on the one side, and the kill switch 130 on the other side of the resistor 122. This resistor 122 prevents damaging current spikes each time the kill switch 130 is activated to short the current $I_{da}$ and drain any charge from the capacitor 680 and/or the capacitor 110.

In this embodiment of the present invention, the operational amplifier 600 can be configured to have two distinct gains depending on whether the laser diode 4 is in or close to a linear operating range (e.g., whether the voltages $V_{pd}$ and $V_{ref}$ have converged). More specifically, the capacitance value of the capacitor 110 is preferably selected so that the gain of the operational amplifier 600 is minimized when the laser diode 4 is in or close to a linear operating range (e.g., a difference between the voltages $V_{pd}$ and $V_{ref}$ is within a defined threshold). In this way, the operational amplifier 600 is unable to null out the electrical signal (e.g., the current $I_{data}$) meant to modulate the optical output of the laser diode 4. In contrast, the capacitance value of the capacitor 680 and the resistance value of the resistor 670 are preferably selected so that the gain of the operational amplifier 600 is maximized when the laser diode 4 is not in or close to a linear operating range (e.g., a difference between the voltages $V_{pd}$ and $V_{ref}$ is beyond a defined threshold).

Figure 8:
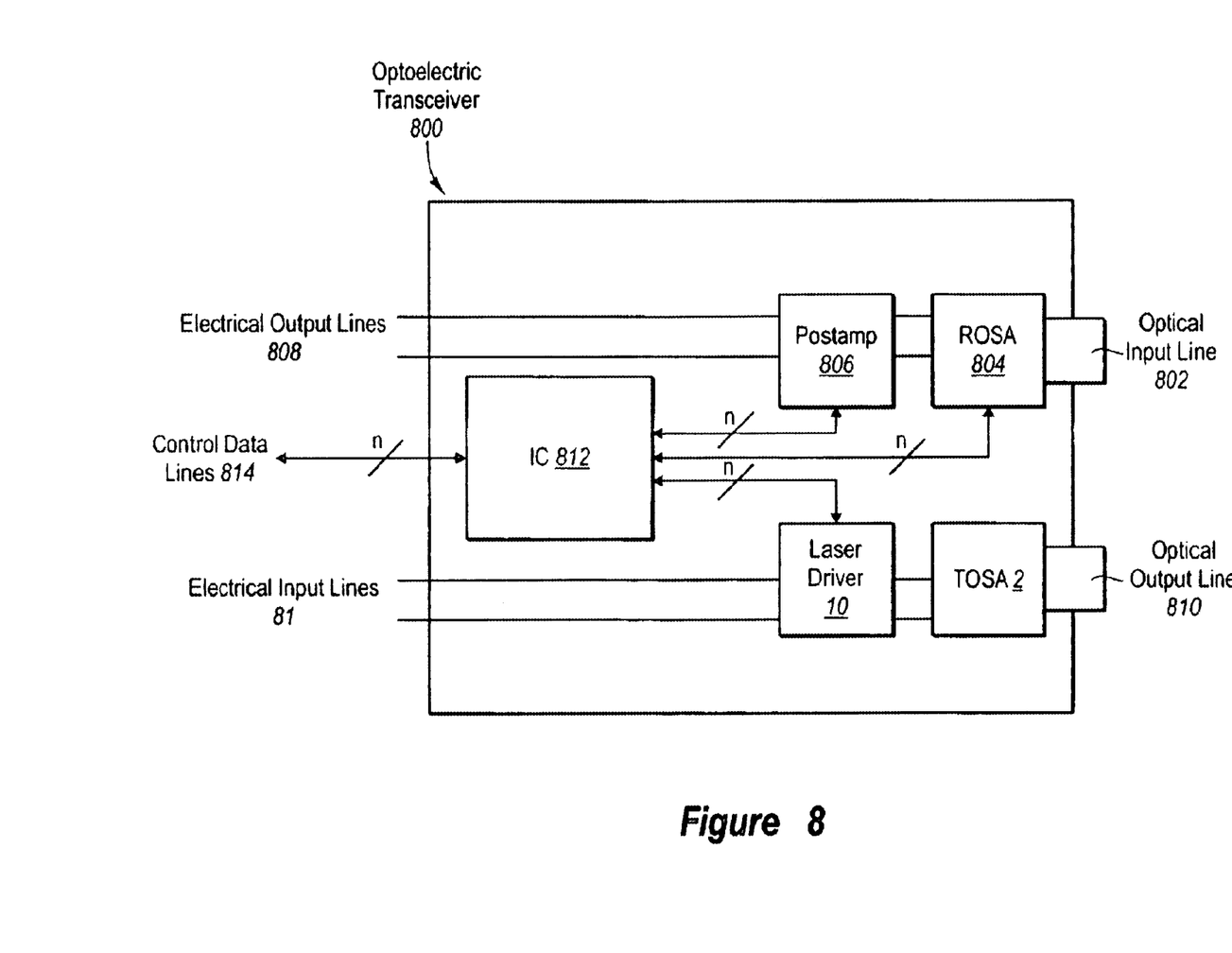
FIG. 8 is an illustration of an optoelectronic transceiver that is consistent with an embodiment of the present invention.

Referring to FIG. 8, there is shown a TOSA 2 and a laser driver 10 consistent with an embodiment of the present invention (e.g., including a laser driver 10 with the differential amplifier 400 illustrated in FIG. 4A and/or the operational amplifier 500 illustrated in FIG. 5 or the operational amplifier 600 illustrated in FIG. 6) incorporated in an optoelectronic transceiver 800. The optoelectronic transceiver 800 also includes a receiver optical subassembly (ROSA) 804, post-amplifier ("postamp") 806, and an integrated circuit ("IC") 812. The ROSA 804 converts optical input received over an optical input line 802 (e.g., optical fiber) to an electrical signal that is fed to the postamp 806, which amplifies and outputs this electrical signal over the electrical output lines 808. As indicated above, the laser driver 10 processes electrical input received over the electrical input lines 81 and feeds the processed electrical input to the TOSA 2, which converts this input to optical output that is transmitted through the optical output line 810.

The IC 812 interfaces with external components (e.g., a controller 912, FIG. 9) through the control data lines 814 to exchange control signals and data. The control signals may include a Loss of Signal signal, a Transmitter Fault Indication signal, a Transmitter Disable Input signal, a Clock signal, and one or more other data signals. Preferably, the control signals may direct the IC 812 to turn optical transmit capabilities of the optoelectronic transceiver 800 on and off. More specifically, one or more of these control signals may direct the IC 812 to turn the laser diode 4 on and off (e.g., to drop $V_{ref}$ to zero, manipulate kill switches, etc.) via the laser driver 10. And as illustrated in FIG. 8, the IC 812 has one or more connections to the laser driver 10, the ROSA 804, and the postamp 806. The IC 812 uses these connections to control the operation of, and to obtain operational data from, the TOSA 2, the laser driver 10, the ROSA 804, and the postamp 806.

Figure 9:
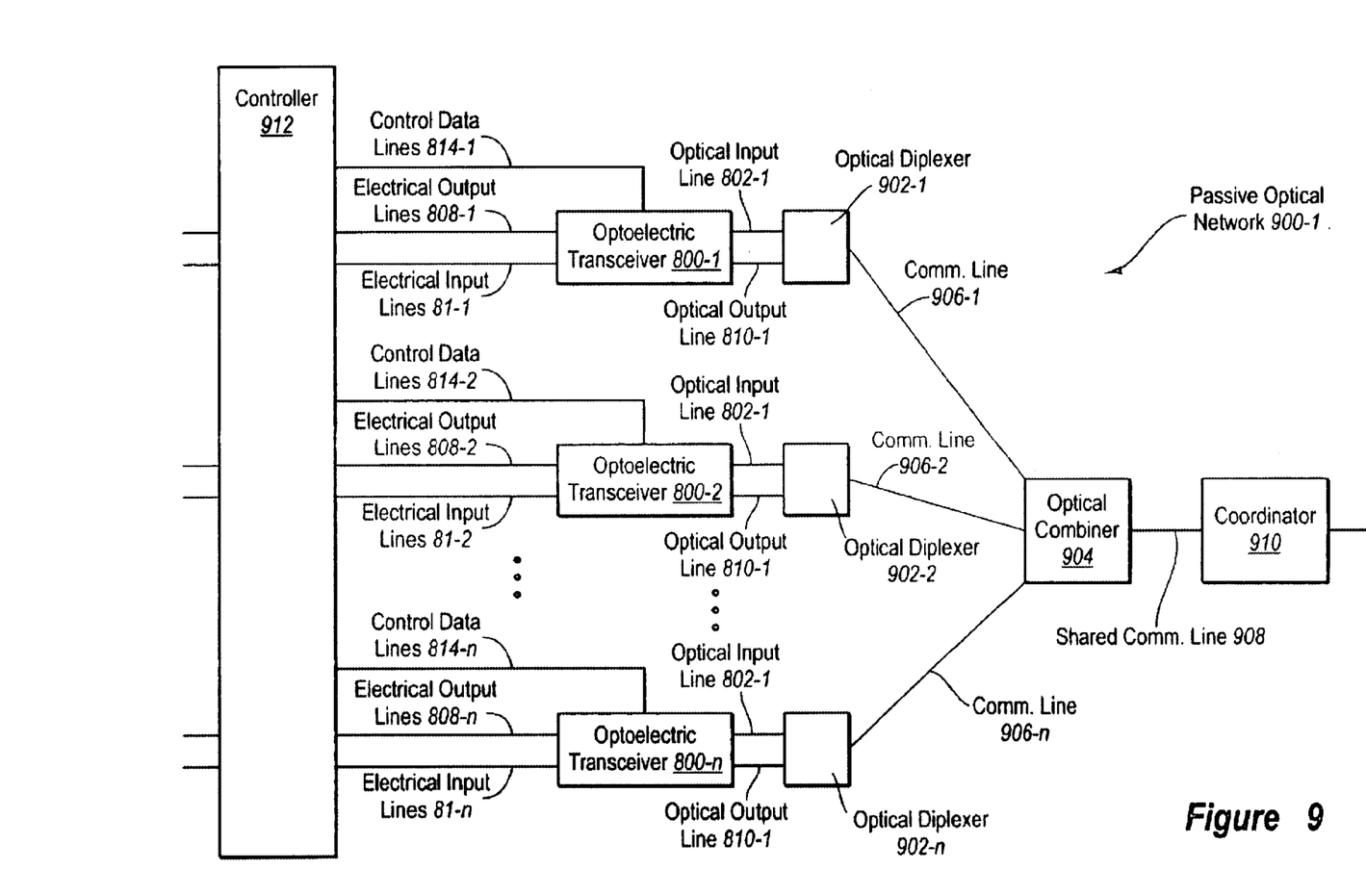
FIG. 9 is an illustration of a passive optical network that is consistent with an embodiment of the present invention.

Referring to FIG. 9, there is shown a portion of an exemplary passive optical network 900. Included in FIG. 9 are a plurality of optoelectronic transceivers 800, a plurality of optical diplexers 902, an optical combiner 904, a plurality of communication lines 906, a shared communication line 908, a coordinator (e.g., an optical gateway, base station, etc.) 910, and a controller 912. The portion of the exemplary passive optical network 900 not illustrated may include elements identical to, and in communication with, some or all of those illustrated in FIG. 9.

As noted above, a passive optical network 900 enables a plurality of optoelectronic transceivers 800 to share one or more optical fibers while transmitting and receiving data in an optical form. Each optoelectronic transceiver 800 illustrated in FIG. 9 represents a separate channel of communication (e.g., channel 1 through channel n). Electrical input that passes through the controller 912 to an optoelectronic transceiver 800 over the electrical input lines 81 is transmitted in an optical form to an optical diplexer 902 through the optical output lines 810. Additionally, optical input received from an optical diplexer 902 by each optoelectronic transceiver 800 through the optical input lines 802 is transmitted in an electrical form over the electrical output lines 808 through the controller 912. The source and destination of electrical input and output, respectively, may vary without departing from the scope of the present invention.

The optical diplexers 902 are devices that exchange data with a first device over a single communication line and with one or more other devices over two or more other communication lines. In preferred embodiments, the optical diplexers 902 communicate with optoelectronic transceivers 800 over the optical input line 802 and the optical output line 810 and communicate with the optical combiner 904 over the communication line 906. So in a preferred embodiment, optical input received from and transmitted to the optical combiner 904 shares the communication line 906, which may be an optical fiber, as illustrated in FIG. 9. This sharing is facilitated by the use of a different wavelengths for optical data exchanged by the optical diplexers and the optical combiner 904. Typically, a wave division multiplexing access ("WDMA") scheme is used to simultaneously transmit a plurality of light signals through an optical fiber. Persons skilled in the art recognize that optical data transmitted in a given wavelength can travel through optical fiber without losing its identity or interfering with optical data transmitted in other wavelengths. Electronic equipment (e.g., an optical diplexer 902) receiving optical data formed by a plurality of wavelengths can distinguish different signals by their respective wavelengths.

The optical combiner 904 (or alternatively, optical combiner and splitter 904) preferably transmits all data received from optoelectronic transceivers 800 to the shared communication line 908 without regard to wavelength or origin and vice versa. In other words, the optical combiner 904 pref-erably does not partition bandwidth of the shared communication line 908. Instead, this partitioning is preferably handled by the controller 912 and the coordinator 910.

The coordinator 910 coordinates the activities of the optoelectronic transceivers 800 illustrated in FIG. 9. In particular, the coordinator 910 determines the timing and duration of optical data transmission by the optoelectronic transceivers 800. Additionally, the coordinator 910 may also interact with other coordinators 910 and controllers 912 (to control other sets of optoelectronic transceivers 800) (not illustrated) in the passive optical network 900 as needed.

Similarly, the controller 912 is an electronic device that controls the optoelectronic transceivers 800. More specifically, the controller 912 turns the optical transmit capabilities (e.g., the laser diode 4) of the optoelectronic transceivers 800 on and off, thus enabling effective use of the shared communication line 908. The controller 912 also monitors data received by the optoelectronic transceivers 800. In particular, the controller 912 determines whether data received by a given optoelectronic transceiver 800 is intended for this optoelectronic transceiver 800, in which case the data may pass through the controller 912 on corresponding electrical output lines 808, whether data received by a given optoelectronic transceiver 800 includes setup or other commands from the coordinator 910 related to this optoelectronic transceiver 800, in which case the data may not pass through the controller 912, or whether data received by a given optoelectronic transceiver 800 is destined for another optoelectronic transceiver 800, in which case the data may not pass through the controller 912.

Typically, when an optoelectronic transceiver 800 is added to the passive optical network 900 and turned on, the controller 912 communicates with the coordinator 910 through the optoelectronic transceiver 800 and the data paths illustrated in FIG. 9 to setup and synchronize the optoelectronic transceiver 800. Typically, the controller 912 and the coordinator 910 use a predetermined channel or bits within transmitted data for such communication. The optoelectronic transceiver 800 does not distinguish between this communication and data received and transmitted after the setup is complete.

Based on turn-on and turn-off capabilities of the optoelectronic transceivers 800 and the number of optoelectronic transceivers 800 included in the passive optical network 900-1, the coordinator 910, among other things, assigns the newly added optoelectronic transceiver 800 to a specific time slot (e.g., a specific portion of a given temporal cycle) and may adjust (e.g., shorten, lengthen, offset, etc.) the time slots to which other optoelectronic transceivers 800 in the passive optical network 900-1 are assigned. The controller 912 is subsequently responsible for turning the optical transmit capabilities of the newly added optoelectronic transceiver 800 on and off at the beginning and end of the newly added optoelectronic transceiver's 800 assigned time slot. Typically, the receive capabilities of a given optoelectronic transceiver 800 are not turned off while the optoelectronic transceiver 800 is part of a passive optical network 900. As noted above, the controller 912 preferably determines whether data received by a given optoelectronic transceiver 800 is intended for this optoelectronic transceiver.

While preferred embodiments of the present invention have been disclosed in connection with FIGS. 4A, 5, 5A, 6, 7, 8, and 9, it will be understood that in view of the foregoing description, other configurations can provide one or more of the features of the present invention, and all such other configurations are contemplated to be within the scope of the present invention. Accordingly, it should be clearly understood that the embodiments of the invention described above are not intended as limitations on the scope of the invention, which is defined only by the claims that are now or may later be presented.

For example, in some embodiments of the present invention, optical diplexers 902 are not used. In these embodiments, two channels of communication (e.g., two strands of optical fiber) connect the optoelectronic transceivers 800 and the optical combiner 904 and the shared communication line 908 consists of two channels of communication (e.g., two strands of optical fiber). In these embodiments, separate wavelengths need not be used to transmit optical data. In still other embodiments, a separate controller 912 is included in the passive optical network 900 for each optoelectronic transceiver.

What is claim is:

1. An operational amplifier for controlling bias current in a laser diode, the operational amplifier comprising:
   a first stage including a differential amplifier receiving as input a reference voltage and a laser diode voltage and having a transconductance that increases exponentially as a difference between the reference voltage and the laser diode voltage increases, wherein said differential amplifier generates an output current based on the input, said laser diode voltage representing an optical output strength of a laser diode, said reference voltage corresponding to a desired magnitude of said laser diode voltage;
   a second stage including a capacitor, the second stage integrating the output current to generate a first output voltage; and
   a third stage including an output buffer, said third stage configured to receive as input the first output voltage to generate a second output voltage approximately equal to said first output voltage, said second output voltage controlling a bias current for the laser diode.

2. The operational amplifier of claim 1, wherein
   the differential amplifier comprises a first transistor, a second transistor, a third transistor, a fourth transistor, a fifth transistor, and a sixth transistor;
   a base of the first transistor is connected to the laser diode voltage, a collector of the first transistor transmits a first current to a current mirror, and the emitter of the first transistor is connected to a base of the second transistor, a first current source, and an emitter of the third transistor;
   a collector of the second transistor is connected to a power supply voltage and an emitter of the second transistor is connected to a base of the fourth transistor and a second current source;
   a collector of the third transistor is connected to ground and a base of said third transistor is connected to a third current source and an emitter of the fifth transistor;
   a collector of the fourth transistor is connected to the ground and an emitter of the fourth transistor is connected to a fourth current source, a base of the fifth transistor, and an emitter of the sixth transistor;
   a collector of the fifth transistor is connected to the power supply voltage;
   a base of the sixth transistor is connected to the reference voltage and a collector of the sixth transistor transmits a second current to the current mirror; and
   the current mirror is configured to produce the output current based on a difference between the first current and the second current.

3. The operational amplifier of claim 1, wherein the second output voltage of the third stage is connected to and regulates a voltage controlled current source, said voltage controlled current source supplying the bias current as determined by the second output voltage.

4. The operational amplifier of claim 1, wherein the reference voltage is set to the desired magnitude of the laser diode voltage.

5. An operational amplifier for controlling bias current in a laser diode comprising:
   a first stage including a differential amplifier, said first stage configured to receive as input a reference voltage and a laser diode voltage to generate an output current, said laser diode voltage representing an optical output strength of a laser diode, said reference voltage corresponding to a desired magnitude of said laser diode voltage, wherein a transconductance of the differential amplifier increases as a difference between the laser diode voltage and the reference voltage increases;
   a second stage including a first capacitor and a charge switch, said second stage configured to integrate the output current produced by the first stage to produce a first output voltage, wherein a voltage comparator activates the charge switch when a difference between said laser diode voltage and said reference voltage is one of greater than and equal to a predefined amount such that a booster current is supplied through the charge switch to the output current;
   a third stage including a second capacitor, said third stage configured to receive as input the first output voltage to produce a second output voltage approximately equal to said first output voltage, said second output voltage controlling a bias current for the laser diode; and
   a set of switches including at least one fast loop switch and a slow loop switch for controlling a gain and frequency bandwidth of the operational amplifier, wherein a state of the at least one fast loop switch and a state of the slow loop switch determines whether the output current flows through the first capacitor or the second capacitor.

6. The operational amplifier of claim 5, wherein the laser diode is in a linear operating range when the difference is less than the predefined amount.

7. The operational amplifier of claim 5, wherein
   the charge switch comprises a first transistor and a second transistor;
   a gate of the first transistor being connected to a voltage output of the voltage comparator, a drain of the first transistor connected to the second stage, a source of the first transistor connected to the current source and to a source of the second transistor;
   a gate of the second transistor connected to a bias voltage and a drain of the second transistor connected to the ground;
   the bias voltage set such that when the voltage output of the voltage comparator indicates that the difference between the laser diode voltage and the reference voltage is one of greater than and equal to the predefined amount substantially all of the boosting current flows from the current source through the first transistor to the second stage; and
   the bias voltage set such that when the voltage output of the voltage comparator indicates that the difference between the laser diode voltage and the reference voltage is less than the predefined amount substantially all of the boosting current flows from the current source through the second transistor to the ground.

8. The operational amplifier of claim 5, wherein the reference voltage is set to the desired magnitude of the laser diode voltage.

9. A operational amplifier for controlling bias current in a laser diode comprising:
- a first stage including a differential amplifier, said first stage configured to receive as input a reference voltage and a laser diode voltage, said laser diode voltage representing an optical output strength of a laser diode, said reference voltage corresponding to a desired magnitude of said laser diode voltage;
- a plurality of second stages, each of said plurality of second stages including a first capacitor and a second capacitor, one of said plurality of second stages producing a first output voltage from an output current produced by the first stage;
- a third stage including, said third stage configured to receive as input the first output voltage to produce a second output voltage approximately equal to said first output voltage, said second output voltage controlling a bias current for the laser diode;
- a set of switches including at least one fast loop switch and a slow loop switch for controlling a gain and frequency bandwidth of the operational amplifier, wherein a state of the at least one fast loop switch and a state of the slow loop switch determines whether the output current flows through the first capacitor or the second capacitor; and
- a voltage comparator to determine a difference between the laser diode voltage and the reference voltage, said voltage comparator controlling selection of the one of said plurality of second stages by reference to said difference between said laser diode voltage and said reference voltage.

10. The operational amplifier of claim 9, wherein the plurality of second stages include
- a slow second stage including a the first capacitor;
- a fast second stage including a resistor in series with the second capacitor, said fast second stage providing comparatively greater gain than the slow second stage across a range of high frequencies.

11. The operational amplifier of claim 10, wherein
the voltage comparator is configured to select the fast second stage from the plurality of second stages when the difference exceeds a predefined amount; and the voltage comparator is configured to select the slow second stage from the plurality of second stages when the difference is one of less than and equal to the predefined amount.

12. The operational amplifier of claim 11, wherein
the laser diode is not in a linear operating range when the difference in excess of the predefined amount.

13. The operational amplifier of claim 11, further comprising:
- an output of the voltage comparator being inverted and connected as a control signal to the first fast loop switch, an output section of a first of the plurality of second stages connected to said first fast loop switch as a current source, and a ground connected to said first fast loop switch as current drain for said first fast loop switch;
- the output of the voltage comparator being inverted and connected as a control signal to a second fast loop switch, an output of a second output buffer connected to said second fast loop switch as a current source for said second fast loop switch, an input section of a second of the plurality of second stages connected to said second fast loop switch as a current drain for said second fast loop switch; and
- the output of the voltage comparator being connected as a control signal to the slow loop switch, said slow loop switch connecting the first of the plurality of second stages to the output buffer;
- whereby, when the output of the voltage comparator is set to a first level, the first of the plurality of second stages is said one of said plurality of second stages producing a first output voltage from an output current produced by the first stage and when the output of the voltage comparator is set to a second level, the second of the plurality of second stages is said one of said plurality of second stages producing a first output voltage from an output current produced by the first stage.

14. The operational amplifier of claim 9, wherein the reference voltage is set to the desired magnitude of the laser diode voltage.

* * * * *

UNITED STATES PATENT AND TRADEMARK OFFICE
CERTIFICATE OF CORRECTION

PATENT NO. : 6,728,276 B2  Page 1 of 1
DATED : April 27, 2004
INVENTOR(S) : Shapiro et al.

It is certified that error appears in the above-identified patent and that said Letters Patent is hereby corrected as shown below:

Column 2,
Line 29, after "first stage" change "if" to -- is --.

Column 4,
Line 44, after "included" insert -- in --.
Line 57, change "have a predefined relationship to each other," to -- has a predefined relationship with $V_{ref}$, --.

Column 5,
Line 40, change "current mirror 340. And" to -- current mirror 340, and --.

Column 6,
Line 1, after "the slope of" change "transconductance," to -- transconductance --.

Column 9,
Line 19, change "capacitor 10." to -- capacitor 110. --.
Line 60, before "to match the voltage" change "10" to -- 110 --.

Column 11,
Line 51, before "different wavelengths" remove "a".

Column 15,
Line 4, before "operational amplifier" change "A" to -- An --.
Line 17, after "a third stage" remove "including, said third stage".
Line 37, before "the first capacitor;" remove "a".

Signed and Sealed this

Twenty-first Day of February, 2006

JON W. DUDAS
*Director of the United States Patent and Trademark Office*